United States Patent [19]

Takahashi et al.

[11] Patent Number: 4,755,337

[45] Date of Patent: Jul. 5, 1988

[54] PROCESS FOR SURFACE TREATING A PLOYESTER FILM

[75] Inventors: Teruo Takahashi; Hirofumi Yoshikawa, both of Hachioji; Sadayoshi Miura, Yamato; Tamaki Kanai, Machida, all of Japan

[73] Assignee: Teijin Limited, Tokyo, Japan

[21] Appl. No.: 849,522

[22] Filed: Apr. 8, 1986

[30] Foreign Application Priority Data

| Apr. 9, 1985 | [JP] | Japan | 60-73444 |
| Jul. 4, 1985 | [JP] | Japan | 60-145730 |
| Jan. 14, 1986 | [JP] | Japan | 61-4193 |

[51] Int. Cl.$^4$ ............... B29C 55/02; B32B 27/08
[52] U.S. Cl. ............... 264/134; 264/210.6; 264/235; 264/236; 427/172; 427/173; 427/386
[58] Field of Search ............... 264/134, 211, 210.6, 264/235, 236; 427/172, 173, 386; 428/423.7; 525/31

[56] References Cited

U.S. PATENT DOCUMENTS

| 3,627,625 | 12/1971 | Jarrett | 264/211 |
| 4,093,458 | 6/1978 | McGrail et al. | 427/173 |
| 4,132,552 | 1/1979 | Poesschen et al. | 428/484 |
| 4,267,288 | 5/1981 | Burkhart et al. | 525/31 |
| 4,364,885 | 12/1982 | Kanai et al. | 264/134 |

FOREIGN PATENT DOCUMENTS

| 15825 | 2/1980 | Japan | 428/423.7 |
| 124617 | 7/1983 | Japan | 264/210.6 |

Primary Examiner—James Lowe
Attorney, Agent, or Firm—Wenderoth, Lind & Ponack

[57] ABSTRACT

A polyester film having on at least one surface thereof a primer layer comprising a crosslinked product of a polyurethane having at least one functional group selected from a carboxyl group, a sulfo group, a hemisulfate group, and salts of these groups and a polyepoxy compound. The polyester film having a primer layer can be produced by coating an aqueous primer coating composition comprising a polyurethane having at least one of a carboxylic acid salt group, a sulfonic acid salt group and a hemisulfate salt group on at least one surface of a polyester film before its crystallization and orientation are completed, and thereafter completing the crystallization and orientation by subjecting the coated film to drying, stretching and heat-treatment, and is useful as a base film for magnetic recording media.

13 Claims, No Drawings

PROCESS FOR SURFACE TREATING A POLYESTER FILM

This invention relates to a surface-treated polyester film. More specifically, it relates to a coated polyester film having superior adhesion and solvent resistance which is useful as a substrate for extensively processed products of polyester films, such as magnetic tapes for audio, video and computer applications, floppy discs, and radiographic films.

It is known to form films by melt-extruding thermoplastic polyesters such as polyethylene terephthalate or copolymers therefore, polyethylene naphthalate or copolymers thereof, or blends of these polyesters with a minor proportion of other resins. It is also known that biaxially stretched heat-set polyester films have better heat resistance, gas-barrier property, electrical properties and chemical resistance than films of other resins. On the other hand, since the surfaces of the polyester films are highly crystallized and oriented, they have the defect that their surfaces have high cohesiveness and poor receptivity of paints, adhesives, inks, etc.

When it is desired to form a synthetic resin layer on the surface of such a polyester film, it is the practice to subject its surface to a corona discharge treatment, an ultraviolet irradiation treatment, a plasma treatment or a flame treatment in advance for firm adhesion between the two, and thereafter apply a coating of the synthetic resin to the so activated surface. By this surface activating means, it is expected to obtain increased adhesion owing to the increased secondary bonding force of the film surface attributed to increased wetting with the coated layer, but this activity of the film surface decreases with time. Hence, this surface activating means has not proved to be entirely satisfactory.

Another method proposed to increase the receptivity of the surface of the polyester film is an etching method whereby the film surface is swollen or partially dissolved with various chemicals. By this method, it is intended to increase the adhesion between the film surface and a resin to be applied to it by bringing the film surface into contact with chemicals having the ability to swell or dissolve the polyester, such as acids, alkalies, aqueous amine solutions, or trichloroacetic acid thereby to locally reduce the crystaline orientation of the polyester near its surface and simultaneously reduce the cohesivensss of the surface. The effect of this method is accurate and the adhesion between the film surface and a layer to be formed on it, for example a synthetic resin coated layer, becomes firm. Some of the chemicals used in this method are toxic and may involve danger in handling. Or they are likely to dissipate into the atmospheric air. Utmost cares, therefore, are necessary to avoid pollution of the working environment, and this method is disadvanageous in practical applications.

A similar method has been proposed which comprises forming a primer layer on the base film surface, forming a thin surface layer dissimilar to the base film, and thereafter, coating a desired layer such as a synthetic resin layer. The formation of the primer is usually effected in a separate step independently of the polyester film-forming process. If polyester films having such an adhesive surface have surface defects due to dust and dirt, they cannot be used as bases for applications where precise and elaborate qualities must be maintained, for example for extensively processed products of films such as magnetic tapes for audio, video and computer applications, floppy discs, radiographic films, photographic films for printing and diazo microfilms. The surface defects, however, are liable to occur in this separate step. It is desirable therefore to apply the primer in an atmosphere having a minimum of dust and dirt. One atmosphere which met this requirement is that in which the polyester film is formed. If the primer treatment is carried out in this film-forming process, it would be possible to obtain a product which is feasible for use in extensively processed film products.

On the other hand, the method of increasing the adhesion of the surface of the polyester film by the primer treatment in the prior art is, in many cases, achieved by coating a primer composition in an organic solvent on the surface portion of the film. When such a method is practiced during the film producing process, the organic solvent will dissipate to pollute the environment and reduce its safety and hygiene and consequently exert adverse effects on the film-forming process. The amount of the organic solvent used should therefore be minimized. Accordingly, when the in-line primer treatment is carried out in the film-forming process, the use of a primer composition containing water as a solvent is desirable in view of economy and safety and the ease of the treatment step.

Many primer compositions using water as a solvent have been proposed, and especially many aqueous solutions or dispersions of polyurethane or polyesters have been proposed. For example, DE No. 1694062 discloses the use of a primer composition of polyurethane having solvent resistance to acetone and dispersibility in water.

These primer compositions, however, are swellable with, or soluble in, solvents used in magnetic coating compositions or the like, such as methyl ethyl ketone, cyclohexanone and tetrahydrofuran, and have insufficient solvent resistance. When a highly polar paint such as a magnetic paint is coated on a layer formed by using such a primer composition, the primer layer gets mixed with the magnetic layer to reduce the adhesiveness of the primer layer, and flow marks occur on the surface of the coated layer. In recent years, the density of recording on coated magnetic recording media has become higher, and the magneic layer has tended to decrease in thickness. In particular, thickness reduction has rapidly been effected in floppy discs, and the thickness of the magnetic layer is now about 1 micrometer.

With such a thin magnetic layer, the occurrence of flow marks makes it difficult to obtain a good magnetic surface, and deteriorates its electromagnetic conversion characteristics.

It is an object of this invention to provide a polyester film having coated thereon a primer layer which has excellent adhesion to various coatings to be formed on it, for example a cellophane ink, a magnetic paint, a gelatin composition, an offset ink, an electrophotographic toner, a chemical mat paint, a diazo paint, a heat-seal-imparting composition, or an inorgnaic film-forming substance, does not develop flow marks when such a coating is formed on it, and which has stable solvent resistance not affected by the coating and drying conditions.

Another object of this invention is to provide a desirable process for producing such a surface-treated polyester film.

Other objects of this invention along with its advantages will become apparent from the following description.

According to this invention, there is provided a polyester film having on at least one surface thereof a primer layer comprising a crosslinked product of a polyurethane having at least one functional group selected from a carboxyl group, a sulfo group, a hemisulfate group, and salts of these groups and a polyepoxy compound.

The polyester film base on which the primer layer is formed in this invention includes films of linear saturated polyesters synthesized essentially from aromatic dibasic acids or ester-forming derivatives thereof and diols or ester-forming derivatives thereof. Specific examples of such polyesters are polyethylene terephthalate, polyethylene isophthalate, polybutylene terephthalate, poly(1,4-cyclohexylene dimethylene terephthalate), polyethylene-2,6-naphthalenedicarboxylate, copolymers of these, and blends of these with a minor proportion (preferably up to 5% by weight) of other miscible thermofusible resins (e.g., polyethylene and polypropylene). Of these, polyethylene terephthalate is especially suitable for use in this invention.

The base polyester film on which the primer layer is to be formed is obtained by melt-extruding such a linear saturated polyester resin into a film form in a customary manner, and crystallizing it by orientation and heat-treatment. The polyester film is crystalline-oriented to such a degree that it has a heat of fusion, measured by a scanning calorimeter in a nitrogen stream at a temperature elevating rate of 10° C./min., of usually at least 4 cal/g.

A polyester film whose center line average surface roughness (Ra) is adjusted to the range of 0.004 to 0.02 micrometer by including fine titanium oxide particles having an average particle diameter of not more than 0.5 micrometer, particularly 0.1 to 0.4 micrometer, is especially suitably used as a base film in this invention.

Inclusion of titanium oxide may be effected usually by adding fine particles of titanium oxide (preferably as a slurry in glycol) to the reaction system during the polyester-forming reaction, for example at any desired time during ester-interchange reaction or polycondensation reaction in the ester-interchange method or at any desired time in the direct polymerization method. Preferably, the fine particles of titanium oxide are added to the reaction system in the early stage of polycondensation, for example before the inherent viscosity, measured in o-chlorophenol at 25° C., of the polymer reaches about 0.3.

The center line average surface roughness (Ra) of the polyester film is preferably not more than 0.02 micrometer in order to secure the smoothness of the magnetic layer. Ra is measured in accordance with JIS B0601 as follows: By using a needle-contacting type surface roughness tester (SURFCOM 3B), the surface roughness curve of a sample film is drawn on a chart under a load of 0.07 g using a needle with a radius of 2 microns. A part having a measured length of L is picked up from the surface roughness curve in a direction along the center line of the curve. Let the center line of the picked up part be X-axis and the longitudinal direction, Y-axis, the roughenss curve is expressed by Y=f(x). The value Ra (micrometers) given by the following equation is defined as the surface roughness of the film.

$$Ra = \frac{1}{L} \int_0^L |f(x)| dx$$

In the present invention the measured length L is made 0.25 mm, and eight surface roughnesses are measured. The three largest values were excluded, and Ra is determined as an average of the remaining five measured values.

According to this invention, a primer layer comprising a crosslinked product of a polyurethane containing at least one functional group selected from a carboxyl group (—COOH), a sulfo group (—SO$_3$H), a hemisulfate group (—OSO$_3$H) and salts of these [—COOM$_{1/n}$, —SO$_3$M$_{1/n}$ and —OSO$_3$M$_{1/n}$, wherein M represents a cation and n is the valence of the cation], preferably the carboxyl group, and a polyepoxy compound is formed on at least one surface of the polyester film base.

The polyurethane having the above functional group can be obtained usually by using a monomer having such a functional group as one material for the synthesis of polyurethane, or by a method comprising introducing such a functional group by utilizing terminal isocyanate groups or other reactive groups that may be present in the polyurethane. For example, a polyurethane containing a carboxyl group or its salt can be obtained by using a carboxyl-containing polyhydroxy compound as one starting polyhydroxy compound in the synthesis of polyurethane; or by reacting a hydroxyl-containing carboxylic acid or an amino-containing carboxylic acid with the isocyanate groups of an isocyanate-terminated polyurethane, and as required, adding the reaction product to an aqueous solution of a base with stirring at high speeds to neutralize it. A polyurethane having the sulfo group or the hemisulfate group or a salt thereof can be produced usually by reacting a polyhydroxy compound, a polyisocyanate and a chain extender to form an isocyanateterminated urethane prepolymer, reacting it with a compound having in the molecule an amino or hydroxyl group and a sulfo group or hemisulfate group or a salt thereof which can react with the terminal isocyanate groups to give a polyurethane having the sulfo or hemisulfate group or a salt thereof in the molecule, and when the functional group is in free acid form, treating the functional group with an aqueous solution of a base to convert it to a salt. Preferably, the urethane prepolymer-forming reaction is carried out in the absence of solvent, and then water is added. Another method comprises synthesizing a polyurethane having the sulfo group using a compound having the sulfo group as one starting material, and as required, adding the polyurethane to an aqueous solution of a base with stirring at high speeds to neutralize it. A polyurethane having the sulfo group or its salt may also be obtained by combining a sultone compound with a primary or secondary amino group that may exist in the main chain or side chain of polyurethane by addition-reaction in the presence of an alkali to thereby introduce an alkali sulfonate group (such as -SO$_3$Na).

Examples of polyhydroxyl compounds which are used in the synthesis of polyurethanes include polyethylene glycol, polypropylene glycol, poly(ethylene/propylene) glycol, polytetramethylene glycol, hexamethylene glycol, tetramethylene glycol, 1,5-pentanediol, diethylene glycol, triethylene glycol, polycaprolactone, OH-terminated polyhexamethylene adipate, OH-terminated polyhexamethylene sebacate, OH-terminated polytetramethylene adipate, OH-terminated polytetramethylene sebacate, trimethylolpropane, trimethylolethane, pentaerythritol, and glycerin. Of these, aliphatic polyester polyols such as the OH-terminated polyhexamethylene adipate, OH-terminated polyhexamethylene sebacate, OH-terminated polytetramethylene adipate, and OH-terminated polytetramethylene sebacate are preferred.

Examples of the polyisocyanate compound used to prepare the polyurethanes include hexamethylene diisocyanate, diphenylmethane diisocyanate, tolylene diisocyanate, isophorone diisocyanate, and isocyanate-terminated urethane prepolymers such as an adduct of tolylene diisocyanate with trimethylolpropane and an adduct of hexamethylene diisocyanate with trimethylolethane. Aliphatic diisocyanates are preferred.

Carboxyl-containing polyols may be used in place of part of the polyhydroxy compound. Examples include dimethylolpropionic acid, dimethylolbutyric acid, dimethylolvaleric acid and bis(ethylene glycol) trimellitate. Examples of the amino-containing carboxylic acid to be reacted with the terminal isocyanate groups of the isocyanate-terminated polyurethane include beta-aminopropionic acid, gamma-aminobutyric acid and p-aminobenzoic acid. Examples of the hydroxyl-containing carboxylic acid are 3-hydroxypropionic acid, gamma-hydroxybutyric acid, p-(2-hydroxyethyl)benzoic acid and malic acid.

Examples of the compounds having both an amino or hydroxyl group and a sulfo group or its salt include aminomethanesulfonic acid, 2-aminoethanesulfonic acid, 2-amino-5-methylbenzene-2-sulfonic acid and sodium betahydroxyethanesulfonate, and addition products between aliphatic di-primary amine compounds (e.g., ethylenediamine or triethylenediamine) and alkylsultones such as propanesultone or butanesultone. Propanesulfone adducts of aliphatic di-primary amine compounds are preferred.

Examples of the compounds having an amino or hydroxyl group and a hemisulfate group include aminoethanol sulfate, ethylenediamine ethanol sulfate, aminobutanol sulfate, hydroxyethanol sulfate, gamma-hydroxypropanol sulfate, and alpha-hydroxybutanol sulfate.

Polyurethanes from the starting compounds described above can be produced by methods known per se, for example the method described in DE No. 1694062. This patent document is hereby cited in lieu of giving a detailed description of the polyurethane production.

Examples of bases that can be used in the neutralizing and salt-forming reaction of the carboxyl group, sulfo group or hemisulfate group that may be present in the starting compounds or the resulting polyurethane include inorganic bases such as sodium hydroxide, potassium hydroxide and ammonia, and organic bases such as aliphatic tertiary amines (e.g., triethylamine, diethylisopropylamine, dimethylethylamine or tri-n-propylamine), diethylamine or methylethylamine. Of these, ammonia and aliphatic tertiary amines which can volatilize under the drying conditions to be described are preferred.

The polyurethanes that can be used in this invention may generally have a number average molecular weight in the range of 10,000 to 500,000, preferably 20,000 to 200,000. The content of the functional group in the polyurethane may be varied depending upon the type of the functional group. Generally, it may be in the range of 0.5 to 15% by weight, and more specifically, it is conveniently in the range of generally $(0.5-10) \times 10^{-4}$ gram-equivalent/g of resin, preferbly $(0.5-5) \times 10^{-4}$ gram-equivalent/g of resin, more preferably $(1-5) \times 10^{-4}$ gram-equivalent/g of resin.

The polyepoxy compound used as a crosslinking agent for the polyurethane containing the particular functional group is a compound having at least two, preferably 2 to 5 epoxy groups, per molecule. In the present invention, aliphatic polyepoxy compounds having good water solubility are suitable. They may have an epoxy equivalent of generally 100 to 600, preferably 100 to 300, more preferably 110 to 200.

Specific examples of the polyepoxy compound are shown below.

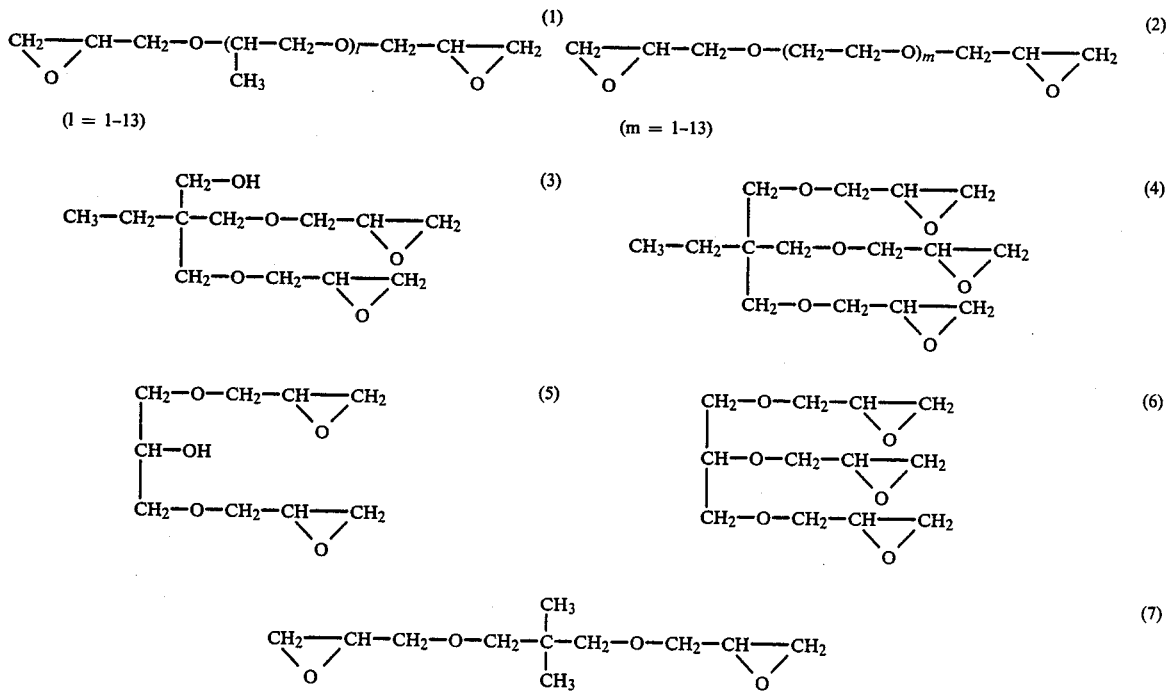

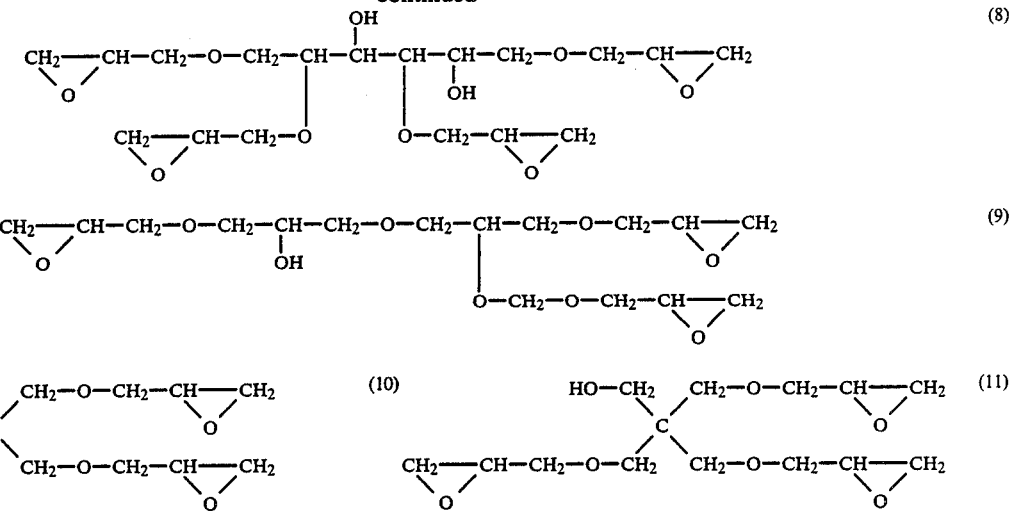

Of these, the polyepoxy compounds (5), (6), (8) and (9) are especially suitable.

The amount of the polyepoxy compound as a crosslinking agent may be varied depending upon the degree of crosslinking required of the primer layer, the amount of the functional group in the polyurethane, etc. Generally, it is 1 to 40 parts by weight, preferably 2 to 30 parts by weight, more preferably 5 to 20 parts by weight, per 100 parts by weight of the polyurethane.

The degree of crosslinkage of the primer layer comprising the crosslinking product of the polyurethane and the polyepoxy compound is not strictly limited. Conveniently, the crosslinked product has such a degree of crosslinkage that it has a blocking force measured by the following method is generally not more than 30 g/15 cm, preferably not more than 20 g/15 cm, more preferably not more than 16 g/15 cm.

Measurement of the blocking force

Two film pieces, 15 cm ×20 cm in size, are cut off from a polyester film having the primer layer formed thereon. The film pieces are laid one on top of the other so that the primer layers contact each other. The film assembly is maintained at 40° C. for 2 hours under a load of 50 kg/cm², and then T-peeled 15 cm in the width direction at a rate of 100 mm/min. The force required to effect the T-peel is measured, and defined as the blocking force (g/15 cm).

The primer layer in accordance with this invention can be formed by coating a liquid mixture of the polyurethane and the polyepoxy compound on at least one surface of the polyester base film, and crosslinking the polyurethane.

The liquid mixture may be a solvent-type composition in an organic solvent. In the present invention, it is advantageously prepared as an aqueous coating composition by dissolving or dispersing it in an aqueous medium utilizing the functional group of the polyurethane.

The aqueous coating composition can be prepared by dissolving and/or dispersing the polyurethane having the functional group in salt form and the polyepoxy compound in an aqueous medium; or adding the polyurethane having the functional group in free form and the polyepoxy compound to an aqueous medium, and neutralizing the functional group of the polyurethane with the aforesaid base to dissolve and/or disperse the polyurethane and the polyepoxy compound in the aqueous medium.

Prior to use, a surface active agent such as an anionic or nonionic surfactants may be added as a surface wetting improver in a required amount to the aqueous coating composition. The surface-active agent is preferably one which can decrease the surface tension of the aqueous coating solution to 40 dynes/cm or below and promote wetting with the polyester film. Examples include polyoxyethylene alkyl phenyl ethers, polyoxyethylene fatty acid esters, sorbitan fatty acid esters, glycerin fatty acid esters, fatty acid metal soaps, alkylsulfuric acid salts, alkylsulfonic acid salts, and alkylsulfosuccinic acid salts.

The aqueous coating composition may, as requried, further contain other additives such as antistatic agents, ultraviolet absorbers, pigments, organic fillers, inorganic fillers, lubricants and antiblocking agents so long as they do not reduce the effect of the present invention.

Furthermore, a compound which promotes crosslinking reaction between the polyurethane containing the functional group and the polyepoxy compound (to be referred to as the "reaction-promoting compound" in the present specification). Examples of the reaction-promoting compound include compounds containing a basic tertiary amino group, heterocyclic compounds having a tertiary nitrogen atom, salts of the heterocyclic compounds, and quaternary ammonium compounds. Specific examples of the basic tertiary amino group-containing compound include trialkylamines such as trimethylamine, triethylamine and tri-n-butylamine, alkylarylamines such as dimethylaminobenzene, alkylaralkylamines such as benzyldimethylamines, and phenolic tertiary amine compounds such as 2,4,6-tris(-dimethylaminomethyl)phenol. Specific examples of tertiary nitrogen-containing heterocyclic compounds and salts thereof include imidazole compounds such as 2-methylimidazole, 2-methyl-4-ethylimidazole, 2-ethylimidazole, 2-isopropylimidazole and 2-phenyl-4-methylimidazole, 1,8-diazobicyclo[5,4,0]undecene-7, and hydrochlorides and carbonates of these compounds. Specific examples of the quaternary ammonium compound are triethylbenzyl ammonium chloride and tetramethyl ammonium chloride. Of these, the phenolic tertiary amine compounds, imidazole compounds and 1,8-diazo-bicyclo[5,4,0]undecene-7 are preferred.

The reaction-promoting compound may be incorporated in an amount of generally 1 to 60 parts by weight, preferably 5 to 50 parts by weight, more preferably 10 to 50 parts by weight, per 100 parts by weight of the polyepoxy compound.

The aqueous primer coating composition prepared as above may be applied to the biaxially stretched heatset polyester film base in an ordinary coating step which is independent of the film-forming step. In such a separate coating step, however, dirt and dust are liable to get into the coating composition, and therefore, for production of base films suitable for highly advanced articles such as magnetic tapes and floppy discs, the coating is desirably carried out in a clean atmosphere. It is preferred therefore to apply the primer coating during the step of producing the polyester film (to perform the so-called "in-line coating". Especially preferably, the aqueous primer coating composition is coated on one or both surfaces of the polyester film before its crystallization and orientation in the film-forming step are completed. The solids concentration of the aqueous primer coating composition used at this time is usually not more than 30% by weight, preferably 0.5 to 10% by weight. The amount of the primer coated is preferably 0.5 to 20 g, especially 1 to 10 g, per m$^2$ of the film, and the suitable thickness of the coated primer layer in the dry state is 0.002 to 0.5 micron, preferably 0.005 to 0.1 micron.

The "polyester film before its crystallization and orientation are completed", as used herein includes, for example, an unstretched film obtained by heat-melting the polyester and molding it into a film form; a monoaxially oriented film obtained by stretching the unstretched film either longitudinally or transversely; and a biaxially stretched film obtained by stretching the unstretched film at low stretch ratios both longitudinally and transversely (before it is finally re-stretched longitudinally or transversely to complete its crystallization and orientation).

The aqueous primer coating composition may be coated by any desired coating method, such as roll coating, gravure coating, roll brush coating, spray coating, air knife coating, impregnation and curtain coating, either singly or in combination.

The polyester film on which the aqueous coating composition has thus been applied is dried, and sent to such steps as stretching and heat setting. For example, a longitudinally stretched polyester film coated with the aqueous primer coating composition is led to a stenter where it is transversely stretched and heat-set. During this time, the coated composition dries and undergoes crosslinking reaction to form a continuous film on the polyester base film. The heat required for the crosslinking reaction is usually supplied by the heat applied during stretching or heat-setting, and its temperature is generally 180° to 250° C. The heating time depends upon the temperature, and may, for example, be about 8 seconds at 220° C., about 10 seconds at 200° C., about 1 minute at 150° C., and about 15 minutes at 120° C. Heat effected under more rigorous conditions or milder conditions. Drying of the coated film may be effected for about 5 seconds at 100° C., for about 5 seconds at 110° C., or for about 20 seconds at 90° C. Or the coated film may be air-dried. The primer composition in accordance with this invention has the advantage that a sufficient crosslinking density can be obtained by such treatment as drying of the applied coating composition and a primer layer having excellent adhesion and solvent resistance can always be obtained.

The orientation and crystallization conditions for the polyester film, for example, the stretching or heat-setting conditions, may be selected from those known per se according to the end use of the film. For example, the stretching may be carried out at 80° to 150° C. for 5 to 20 seconds, and the heat-setting may be carried out at 180° to 250° C. for 5 to 20 seconds.

The present invention has the great advantage that the primer layer can be applied by the in-line coating method, and therefore can be provided in a much smaller thickness than in the prior art.

The polyester film of this invention having the particular primer layer has high adhesion to a very broad range of paints such as an ink for cellophane, a magnetic paint, a gelatin composition, an electrophotographic toner composition and a chemical mat paint, and excellent solvent resistance to organic solvents such as methyl ethyl ketone, toluene, ethyl acetate, butyl acetate, ethanol, dioxane, tetrahydrofuran. cyclohexanone, and cyclohexane.

The polyester film having the primer layer provided by this invention is particularly suitable as a base film for magnetic recording media. A magnetic recording layer may be formed on the primer layer of the film of this invention by techniques built up in the art. Generally, the magnetic layer is composed of an organic polymeric compound as a binder, a magnetic powder, and additives such as a lubricant, antistatic agent, polishing agent, or dispersant. Examples of the binder are thermoplastic resins such as vinyl chloride/vinyl acetate copolymer, polyurethane resins, nitrocellulose and saturated polyester resins, epoxy resins, thermosetting resins comprising thermoplastic resins and crosslinking agents such as polyisocyanate compounds, and polyfunctional acrylates crosslinkable by heat, actinic light, electron beams, etc. Acicular fine particles such as gamma-$Fe_2O_3$, Co-gamma-$Fe_2O_3$, $CrO_2$, Fe and barium ferrite may be used as the magnetic powder. Examples of the lubricant are silicone oils, carbon, graphite, fatty acids and fatty acid esters. Carbon black may be used as the antistatic agent. Examples of the polishing agent are $Al_2O_3$ and $Cr_2O_3$. Lecithin and surfactants may be used as the dispersant.

The following examples illustrate the present invention further. All parts in these examples are by weight. The properties of the films were measured by the following methods.

[1] Adhesion

A paint for evaluation was coated on a sample polyester film having a primer layer, and dried at 80° C. for 1 minute, thereafter cured at 60° C. for 24 hours, and roll-coated so that the average thickness of the coating became 2 micrometers. The coated film was abraded with an RCA abrasion tester (made by RCA Company) under a head load of 50 g. The number of abrasion cycles until the coated surface was holed was determined and made a measure of adhesion.

Preparation of the Paint for Evaluation

Nitrocellulose (RS 1/2, flakes containing 25% of isopropanol; made by Daicell Co., Ltd.) was dissolved in a thinner of a lacquer to form a 40% by weight solution. A ball mill was charged with 43.9 parts of the resulting solution and then with 32.5 parts of a polyester resin (Desmophen #1700, a product of Bayer AG), 2.60 parts of a magnetic powder of chromium dioxide, 1 part of a soybean oil fatty acid (Lecion P, a product of Riken Vitamin Co., Ltd.), 0.5 part of a cationic surfactant (Cation AB, a product of Nippon Oils and Fats Co., Ltd.) and 0.8 part of squalane (shark liver oil) as a dispersant or a wetting agent. A mixed solution (282 parts) composed of methyl ethyle ketnone/cyclohexanone/toluene (weight ratio 3/4/3) was added. The mixture was fully milled to prepare a base paint (45% by weight). Fifty parts of the base paint was mixed with 48 parts of an adduct of trimethylolpropane and toluene disiocyanate (Coronate L, a product of Japan Polyurethane Industry Co., Ltd.) and 6.25 parts of butyl acetate to obtain a magnetic paint having a solids content of 42.75% by weight.

[2] Solvent resistance

One drop (about 0.02 cc) of tetrahydrofuran (THF) or cyclohexanone (CHX) was dropped onto the surface of the sample polyester film having a primer coating layer by means of a squirt. A gauze was placed on it and a weight (100 g) was further placed on it. The gauze was moved at a speed of about 1000 mm/min. After drying at room temperature, the sample treated with tetrahydrofuran or cyclohexanone and a non-treated sample were photographed through an interference microscope at a magnification of 400. The photographs were compared, and the change of the surface of the primer layer was evaluated on the following scale.

X : most of the primer was removed
O : hardly any change occurred in the primer
O ~ Δ : an intermediate condition between X and O and the surface morphology changed a little
X ~ Δ : the surface morphology considerably changed
Δ : the change of the surface morphology was intermedaite between the above two

EXAMPLE 1

An aqeuous primer coating composition having a solids concentration of 4% by weight was prepared by diluting 78 parts (as nonvolatile components) of an aqueous dispersion of polyurethane having a carboxylic acid amine salt group (Melusi-545, a tradename for aliphatic polyester polyurethane having a molecular weight of about 40,000 and containing $3 \times 10^{-4}$ gram-equivalent/g of functional groups manufactured by Toyo Polymer Co., Ltd.), 10 parts of polyoxyethylene nonyl phenyl ether (tradename NS-240, a product of Nippon Oils and Fats Co., Ltd.;

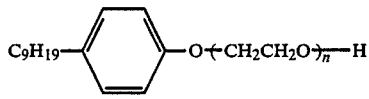

where n is about 40), 10 parts of a polyepoxy compound (Melsi AD-C-65, a tradename for a product of Toyo Polymer Co., Ltd.; epoxy equivalent $5.9 \times 10^{-3}$ gram-equivalen/g), and 2 parts of 2,4,6-tris(dimethylaminomethyl)phenol with deionized water.

The coating composition was coated on a biaxially oriented polyethylene terephthalate film by a gravure coating method, and then heat-treated for 45 seconds in a drying zone at 140° C. to obtain a polyester film having a primer coated layer formed on it at an average rate of 50 mg (in the dry state)/m².

This coated film had sufficient adhesion to the magnetic paint for evaluation, and the coated surface was of good quality without flow marks.

EXAMPLE 2

Polyethylene terephthalate (containing a filler) having an inherent viscosity, measured in o-chlorophenol at 25° C., of 0.65 was melt-extruded onto a rotating cooled drum kept at 20° C. to form an unstretched film having a thickness of 950 micrometers, and then stretched to 3.5 times in the machine direction. The same coating composition as prepared in Example 1 was coated on both surfaces of the monoaxially stretched film. The film was subsequently stretched to 3.9 times in the transverse direction at 105° C., and then heat-treated at 210° C. to form a biaxially oriented polyester film having a thickness of 75 micrometers having the primer layer formed on both surfaces. The average rate of coating was 50 mg as solids/m².

EXAMPLES 3-4

In each run, a coated polyester film was produced in the same way as in Example 2 except that diglycerol triglycidyl ether (Example 3) or ethylene glycol diglycidyl ether (Example 4) was used instead of the polyepoxy compound used in Example 2.

EXAMPLES 5-6

In each run, a coated polyester film was produced in the same way as in Example 2 except that 2-methylimidazole (Example 5) or 2-methyl-4-ethylimidazole (Example 6) was used instead of the reaction-promoting compound used in Example 2.

EXAMPLE 7

A coated polyester film was produced in the same way as in Example 2 except that a polyurethane dispersion containing a carboxylic acid amine salt group (Hydran HW-100, a tradename for a product of Dainippon Ink and Chemicals, Co., Ltd.; polyester polyurertane having a carboxylic acid amine salt group content of $5 \times 10^{-4}$ gram-equivalent/g and a molecular weight of about 15,000) was used instead of the coating composition used in Example 2.

EXAMPLE 8

A coated polyester film was produced in the same way as in Example 2 except that an aqueous dispersion of polyurethane containing $2.5 \times 10^{-4}$ equivalent/g of $-OSO^-_3$ groups in the molecule and synthesized from an aliphatic polyester derived from adipic acid, sebacic acid, 1,5-pentanediol and neopentyl glycol and having an OH value of 53, hexamethylene diisocyanate, aminoethanol hemisulfate and potassium hydroxide was used instead of the coating composition used in Example 2.

COMPARATIVE EXAMPLE 1

For comparison, a polyethylene terephthlate film having a thickness of 75 micrometers and having no primer layer was used for evaluating various properties.

COMPARATIVE EXAMPLE 2

A coated polyester film was produced in the same way as in Example 2 except that the epoxy resin and the reaction-promoting compound were not used and the aqueous polyurethane resin was used in an amount of 90 parts and the polyoxynonyl phenyl ether was used in an amount of 10 parts.

The adhesions and solvent resistances of the polyester films obtained in Examples 1 to 8 and Comparative Examples 1 to 2 were measured, and the results are shown in Table 1. They were also tested for blocking force (g/15 cm). The results are also shown in Table 1.

TABLE 1

| Ex. or CEx. | Adhesion (cycles) | Solvent resistance THF | Solvent resistance CHN | Blocking force (g/15 cm) |
| --- | --- | --- | --- | --- |
| Ex. 1 | 7 | O | O | 12 |
| Ex. 2 | 8 | O | O | 9 |
| Ex. 3 | 8 | O | O | 9 |
| Ex. 4 | 8 | O | O | 11 |
| Ex. 5 | 7 | O | O | 13 |
| Ex. 6 | 8 | O | O | 13 |
| Ex. 7 | 8 | O | O | 16 |
| Ex. 8 | | | | 16 |
| CEx. 1 | 1 | — | — | 0 |
| CEx. 2 | 8 | O~Δ | Δ | 60 |

Ex. = Example; CEx. = Comparative Example

The results shown in Table 1 demonstrate that the primer layers of the films of this invention have excellent solvent resistance and adhesion.

EXAMPLE 9

Polyethylene terephthalate (containing 0.5% by weight of titanium oxide having an average particle diameter of 0.3 micrometer) having an inherent visosity, measured in o-chlorophenol at 25° C., of 0.65 was melt-extruded onto a rotating cooled drum kep at 20° C. to obtain an unstretched film having a thickness of 950 micrometers. The film was then stretched to 3.5 times in the machine direction, and coated on both surfaces with the same coating composition as prepared in Example 1 by the kiss coating method. Subsequently, the film was stretched to 3.9 times in the transverse direction at 105° C., and heat-treated at 210° C. to form a polyester base film having the primer coated layer on both surfaces and also having a thickness of 75 microns and an Ra of 0.01 micrometer. The average rate of coating was 20 mg as solids/m$^2$.

A composition composed of the following ingredients:

| | |
| --- | --- |
| gamma-Fe$_2$O$_3$ | 70 parts |
| A binder for magnetic recording composed of a polyurethane elastomer and vinyl chloride/vinyl acetate copolymer having a hydroxyl group | 17 parts |
| Carbon black | 5 parts |
| Dispersant | 2 parts |
| Higher fatty acid ester | 3 parts |
| Crosslinking agent composed of polyisocyanate | 2 parts |
| Tetrahydrofuran/cyclohexane solvent | 180 parts |

Tetrahydrofuran/cyclohexane solvent 180 parts was coated on both surfaces of the base film so that the thickness of the coating on each surface became 1.0 micrometer on drying. The coated film was dried and the surface was calendered. The film was then heated and cured, and punched out in a disc form. The surface of the magnetic layer was polished with a lapping tape having alumina with an average particle diameter of 2 micrometers as an abrasive agent to obtain a floppy disc.

EXAMPLE 10

A floppy disc was produced in the same way as in Example 9 except that an aliphatic polyester polyurethane (Neorez R-966, a tradename for a product of Polyvinyl Chemicals, Inc., molecular weight about 200,000, carboxylic acid amine salt group content $1.5 \times 10^{-4}$ gram-equivalent/g) was used instead of the coating composition used in Example 9.

COMPARATIVE EXAMPLE 3

For comparison, a floppy disc was produced in the same way as in Example 9 except that the primer coating composition was not coated.

The floppy discs obtained in Examples 9 and 10 and Comparative Example 3 were tested for durability at an ambient temperature of 50° C. using a 5.25-inch both surface-type floppy disc device. The durability time of the floppy discs was expressed by the time which elapsed until the output level became 80% or less of the initial value when the floppy discs was continuously rotated under a head load on the same track.

The results are shown in Table 2.

TABLE 2

| Ex. or CEx. | Blocking force of the primer-coated film (g/15 cm) | Durability time (hours) |
| --- | --- | --- |
| Ex. 9 | 8 | >240 |
| Ex. 10 | 2 | >240 |
| CEx. 3 | 0 | 90 |

It is seen from Table 2 that the floppy discs produced by using the primer-coated films of the invention as bases have excellent durability and can withstand use for an extended period of time.

What is claimed is:

1. A process for producing a polyester film having a primer layer, which comprises coating a crosslinkable aqueous primer coating composition comprising a polyurethane having $(0.5-10) \times 10^{-4}$ gram equivalent/gram of resin of at least one of a carboxylic acid salt group, a sulfonic acid salt group and a hemisulfate salt group and a polyepoxy compound as a crosslinking agent on at least one surface of a polyester film before its crystallization and orientation are completed, and thereafter completing the crystallization and orientation by subjecting the coated film to a drying, stretching and heating treatment.

2. The process of claim 1 wherein the polyurethane has a number average molecular weight in the range of 10,000 to 500,000.

3. The process of claim 1 wherein the polyurethane is a polyurethane obtained by introducing the functional group into a polyurethane formed from an aliphatic polyester polyol and an aliphatic diisocyanate.

4. The process of claim 1 wherein the polyurethane has the carboxyl acid salt group.

5. The process of claim 4 wherein the carboxylic acid salt group is a group of a salt formed between carboxylic acid and an aliphatic tertiary amine.

6. The process of claim 1 wherein the polyepoxy compound is a water-soluble aliphatic polyepoxy compound.

7. The process of claim 1 wherein the polyepoxy compound has an epoxy equivalent in the range of 100 to 600.

8. The process of claim 1 the polyepoxy compound is selected from

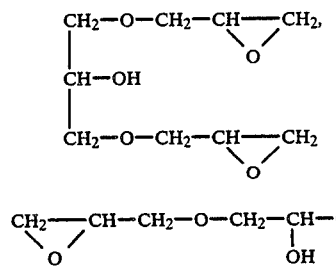 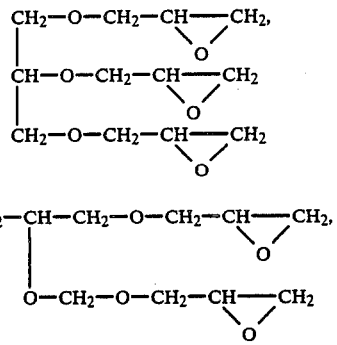

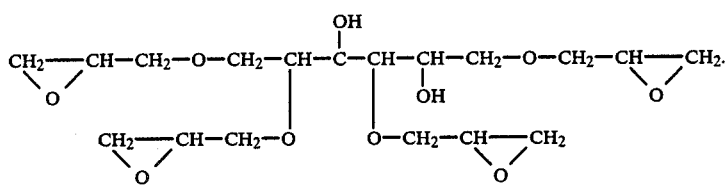

9. The process of claim 1 wherein the polyepoxy compound is used in an amount of 1 to 40 parts by weight per 100 parts by weight of the polyurethane.

10. The process of claim 1 wherein the aqueous primer coating composition further comprises a reaction-promoting compound.

11. The process of claim 10 wherein the reaction-promoting compound is selected from phenolic tertiary amine compounds, imidazole compounds and 1,8-diazobicyclo [5,4,0]undecene-7.

12. The process of claim 11 wherein the reaction-promoting compound is used in an amount of 1 to 60 parts by weight per 100 parts by weight of the polyepoxy compound.

13. The process of claim 1 wherein the polyester film contains fine particles of titanium dioxide having an average particle diameter of not more than 0.5 micrometer and has a center line average surface roughness (Ra) in the range of 0.004 to 0.02.

* * * * *